(12) United States Patent
Lu et al.

(10) Patent No.: US 6,965,169 B2
(45) Date of Patent: Nov. 15, 2005

(54) HYBRID INTEGRATED CIRCUIT PACKAGE SUBSTRATE

(75) Inventors: Shelton Lu, Hsin-Tien (TW); Kenny Chang, Hsin-Tien (TW)

(73) Assignee: VIA Technologies, Inc., Taipei Hsien (TW)

( * ) Notice: Subject to any disclaimer, the term of this patent is extended or adjusted under 35 U.S.C. 154(b) by 0 days.

(21) Appl. No.: 10/692,589

(22) Filed: Oct. 24, 2003

(65) Prior Publication Data

US 2004/0251559 A1    Dec. 16, 2004

(30) Foreign Application Priority Data

Jun. 16, 2003    (TW) ............................... 92210917 U

(51) Int. Cl.$^7$ ............................................. H01L 21/31
(52) U.S. Cl. .................... 257/778; 428/209; 257/704; 257/737; 257/738; 257/428; 257/209; 257/620
(58) Field of Search ................................. 257/704, 737, 257/738, 778, 428, 209, 620

(56) References Cited

U.S. PATENT DOCUMENTS

| | | | |
|---|---|---|---|
| 5,080,958 A | * | 1/1992 | Patterson et al. ............ 428/209 |
| 5,976,710 A | * | 11/1999 | Sachdev et al. ............. 428/620 |
| 6,538,213 B1 | * | 3/2003 | Carden et al. ............... 174/262 |

* cited by examiner

*Primary Examiner*—David Nelms
*Assistant Examiner*—Mai-Huong Tran
(74) *Attorney, Agent, or Firm*—J.C. Patents

(57) ABSTRACT

A hybrid integrated circuit (IC) package substrate at least comprising a plurality of patterned conductive layers stacked over each other. The outermost patterned conductive layer has a plurality of bonding pads thereon. The hybrid IC package substrate also has a plurality of dielectric layers respectively sandwiched between two neighboring patterned conductive layers. At least one of the dielectric layers is a ceramic dielectric layer and at least one of the remaining dielectric layers is an organic dielectric layer. There is also a plurality of vias passing through at least one of the dielectric layers for connecting at least two patterned conductive layers electrically.

3 Claims, 3 Drawing Sheets

1

HYBRID INTEGRATED CIRCUIT PACKAGE SUBSTRATE

CROSS-REFERENCE TO RELATED APPLICATION

This application claims the priority benefit of Taiwan application serial no. 92210917, filed Jun. 16, 2003.

BACKGROUND OF THE INVENTION

1. Field of Invention

The present invention relates to a chip package structure. More particularly, the present invention relates to a hybrid integrated circuit (IC) carrier for a chip package structure.

2. Description of Related Art

With great advance in the electronic technology in recent years, many high-tech electronic products are out in the market. Many electronic products are multi-functional, compact and increasingly personalized to fit a particular need. At present, integrated circuit (IC) carrier is a major component in packaging a semiconductor chip. The IC carrier is a substrate comprising a plurality of patterned conductive layers and a plurality of dielectric layer alternately stacked and laminated over each other. The dielectric layer is positioned between two neighboring patterned conductive layers. The patterned conductive layers are electrically connected through plating through hole in the dielectric layer or conductive vias. Because the IC carrier has many advantages including compact wiring, tight assembly and superior electrical properties, it has become a mainstream substrate for packaging chips.

At present, the two principle methods of packaging a chip includes wire bonding and flip chip bonding. FIG. 1 is a schematic cross-sectional diagram showing the structure of a conventional flip chip package. As shown in FIG. 1, the chip package 100 comprises an integrated circuit carrier 110 and a chip 120. The chip 120 is set up on the first surface 112 of the IC carrier 110. Through a plurality of bumps 126, the chip 120 is electrically connected to the contact pads 116a on the IC carrier 110. In addition, the IC carrier 110 has a plurality of contacts 118 on the second surface 114 of the IC carrier 110. The contacts 118 are solder balls, contact pins or metallic bumps, for example. Furthermore, the contacts 118 are connected electrically to corresponding bumps 126 via the patterned circuit layer 130 in the IC carrier 110. Hence, these contacts 118 serve also as point of contact between the chip 120 and the contacts on a printed circuit board (not shown). Additionally, the IC carrier 110 can be classified as an organic substrate or a ceramic substrate according to the dielectric material used. The production method and electrical properties for these two types of substrate differ considerably, and thus each type of substrate has a particular area of use. The organic substrate is fabricated using material including glass epoxy resin (FR-4, FR-5), bismaleimide-triazine (BT) or epoxy resin. The organic substrate can be a multi-layered substrate fabricated using a lamination and/or a build-up method. On the whole, the fabrication cost of the organic substrate and the dielectric constant of an organic substrate are lower than a ceramic substrate. Consequently, the organic dielectric substrate is used to be the only option for fabricating chip packages chips and manufacturing printed circuit boards.

FIG. 2 is a schematic cross-sectional view of a portion of a conventional chip package substrate. An organic dielectric substrate 210 with six (2-2-2) conductive layers is used as an example. A dielectric layer 202 is formed between every pair of neighboring patterned conductive layers 214. The dielectric layer 202 comprises a dielectric core layer 202(c). Organic dielectric layers 202(b) and 202(a) are sequentially formed on the upper surface of the dielectric core layer 202(c) using a built-up method, for example. Similarly, organic dielectric layers 202(d) and 202(e) are sequentially formed on the lower surface of the dielectric core layer 202(c) using a built-up method. A plurality of plated through holes (PTH) 216 pass through the dielectric core layer 202(c) such that the two terminals of the plated through hole 216 connect electrically with two patterned conductive layers 214(c) and 214(d) respectively. Additionally, a plurality of vias 218 are buried in the organic dielectric layers 202(a), 202(b), 202(d), 202(e) outside the dielectric core layer 202(c) for connecting two neighboring patterned conductive layers 214(a), 214(b), 214(c) or 214(d), 214(e), 214(f). Moreover, the outermost patterned conductive layers 214(a) and 214(f) each has a plurality of bonding pads 220a and 220b. The bonding pads 220a are used for connecting with the bumps (not shown) on the chip. A plurality of contact 222 is also attached to the surface of the bonding pads 220b for connecting to corresponding contacts on a printed circuit board (not shown).

FIG. 3 is a schematic cross-sectional view of a portion of another conventional chip package substrate. An organic dielectric substrate 230 with six (1-4-1) conductive layers is used as an example. A dielectric layer 232 is set up between each pair of neighboring patterned conductive layers 234. The dielectric layer 232 includes a dielectric core layer 232(c). Organic dielectric layers 232(b) and 232(d) are formed on the upper and the lower surface of the dielectric core layer 232(c) using a lamination method, for example. Thereafter, organic dielectric layers 232(a) and 232(e) are formed on the outermost layers using a built-up method, for example. In addition, a plurality of plated through holes (PTH) 236 pass through the dielectric core layer 232(c) and the two organic dielectric layers 232(b) and 232(d). Furthermore, the plated through holes 236 also connect any two of the stacked patterned conductive layers 234(b), 234(c), 234(d), 234(e) electrically. Moreover, a plurality of vias 238 is buried within the outermost organic dielectric layers 232(a) and 232(e). The vias 238 are respectively connected to two neighboring patterned conductive layers 232(a) and 232(b) or 232(e) and 232(f). Moreover, each the outermost patterned conductive layers 234(a) and 234(f) has a plurality of bonding pads 240a and 240b. The bonding pads 240a are used for connecting with the bumps (not shown) on the chip. A plurality of contacts 242 are also attached to the surface of the bonding pads 240b respectively for connecting to corresponding contacts on a printed circuit board (not shown).

As shown in FIG. 1, the conventional IC carrier 110 has a dielectric core layer 132 having a thickness of about 800 $\mu$m. The dielectric core layer 132 is fabricated using fiber material and organic resins to increase the hardness of the IC carrier 110. However, a mechanically drilled plated through hole 136 is limited by the material constituting the dielectric core layer 132 to a smallest diameter of about 250 $\mu$m. Consequently, there is a limitation on the circuit density of the patterned circuit layers 130, 134 on two sides of the dielectric core layer 132. Moreover, pitches of two neighboring plated through holes 136 must be grater than 550 $\mu$m. Hence, the wiring length in the patterned conductive layers 130, 134 connecting the bonding pads 116a, 116b must be increased leading to a longer signal transmission path inside the package.

Therefore, a chip package substrate capable of cramming more wires per unit area and having more wires with a shorter length is an important precondition for fabricating a chip package with high-density circuits and high pin count.

SUMMARY OF THE INVENTION

Accordingly, one object of the present invention is to provide a hybrid integrated circuit (IC) package substrate capable of increasing circuit density inside the substrate and reducing the wiring length of patterned conductive layer.

To achieve these and other advantages and in accordance with the purpose of the invention, as embodied and broadly described herein, the invention provides a hybrid integrated circuit (IC) package substrate. The hybrid IC package substrate at least comprises a plurality of patterned conductive layers stacked over each other. The outermost patterned conductive layer has a plurality of bonding pads thereon. In addition, the hybrid IC package substrate also has a plurality of dielectric layers respectively sandwiched between two neighboring patterned conductive layers. At least one of the dielectric layers is a ceramic dielectric layer and at least one of the remaining dielectric layers is an organic dielectric layer. Moreover, there is a plurality of vias respectively passing through any one of the dielectric layers for connecting at least two patterned conductive layers electrically.

In this invention, a hybrid dielectric structure comprising a ceramic dielectric layer and an organic dielectric is used. Therefore, the diameter of the plated through hole in the ceramic dielectric layer can be reduced to increase wiring density in the patterned conductive layers. Moreover, the pitch between two plated through holes in the ceramic dielectric layer can be reduced to decrease overall wiring length and increase signal transmission performance of the substrate. In the meantime, the ceramic dielectric layer is harder than the organic dielectric layer so that rigidity of the package substrate is enhanced.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1:
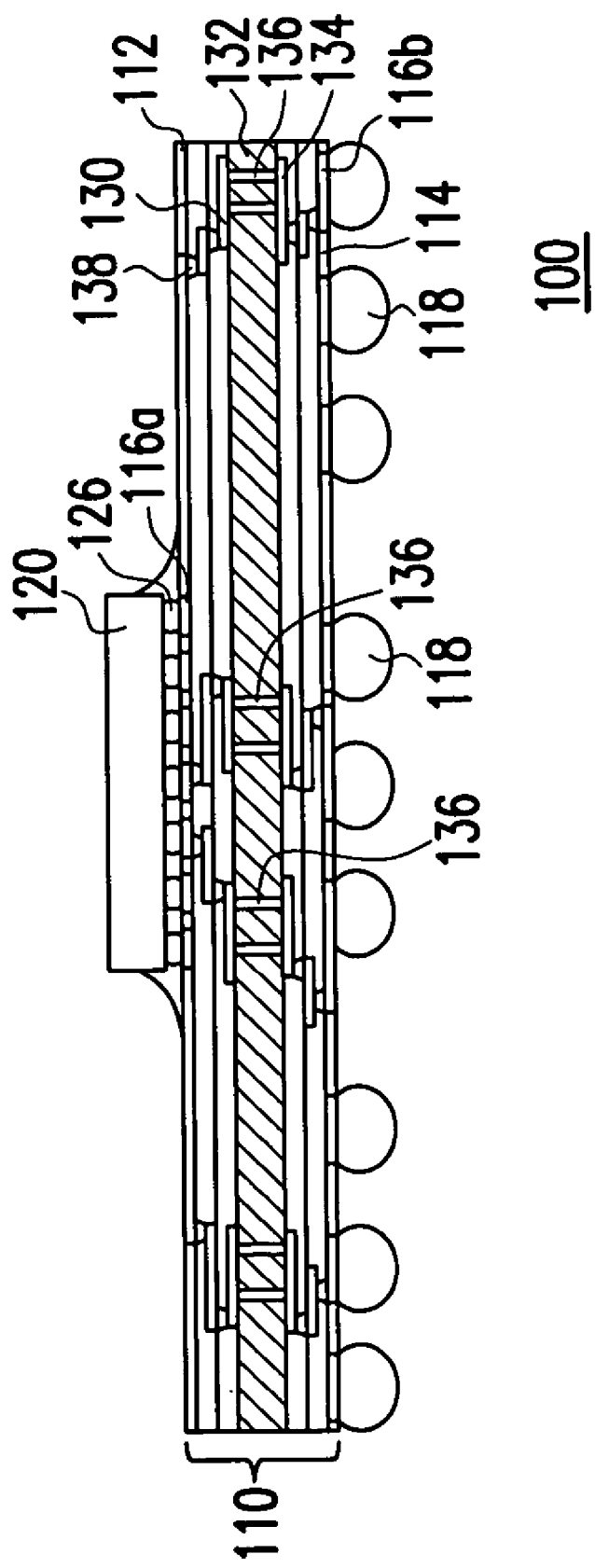
FIG. 1 is a schematic cross-sectional diagram showing the structure of a conventional flip chip package.
Figure 2:
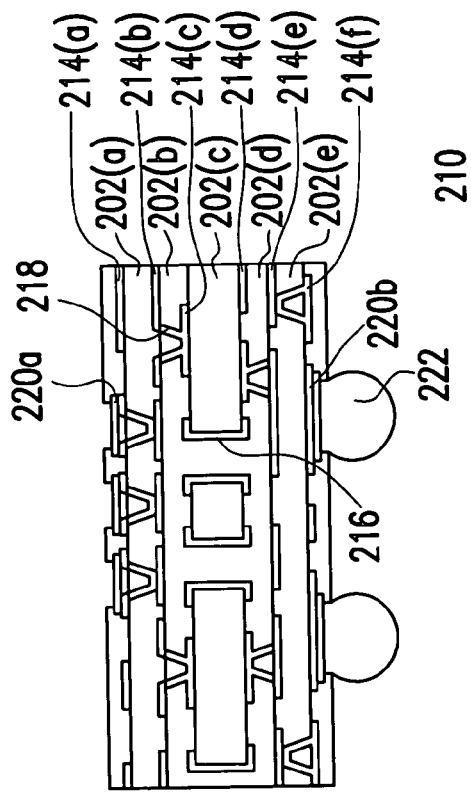
FIG. 2 is a schematic cross-sectional view of a portion of a conventional chip package substrate.
Figure 3:
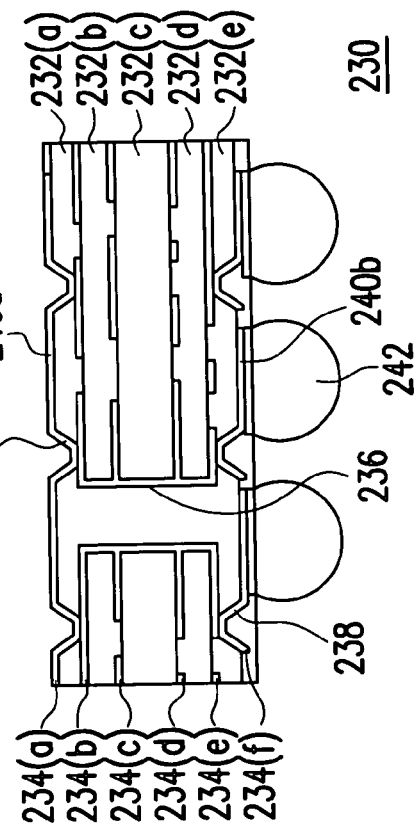
FIG. 3 is a schematic cross-sectional view of a portion of another conventional chip package substrate.

Reference will now be made in detail to the present preferred embodiments of the invention, examples of which are illustrated in the accompanying drawings. Wherever possible, the same reference numbers are used in the drawings and the description to refer to the same or like parts.

Figure 4:
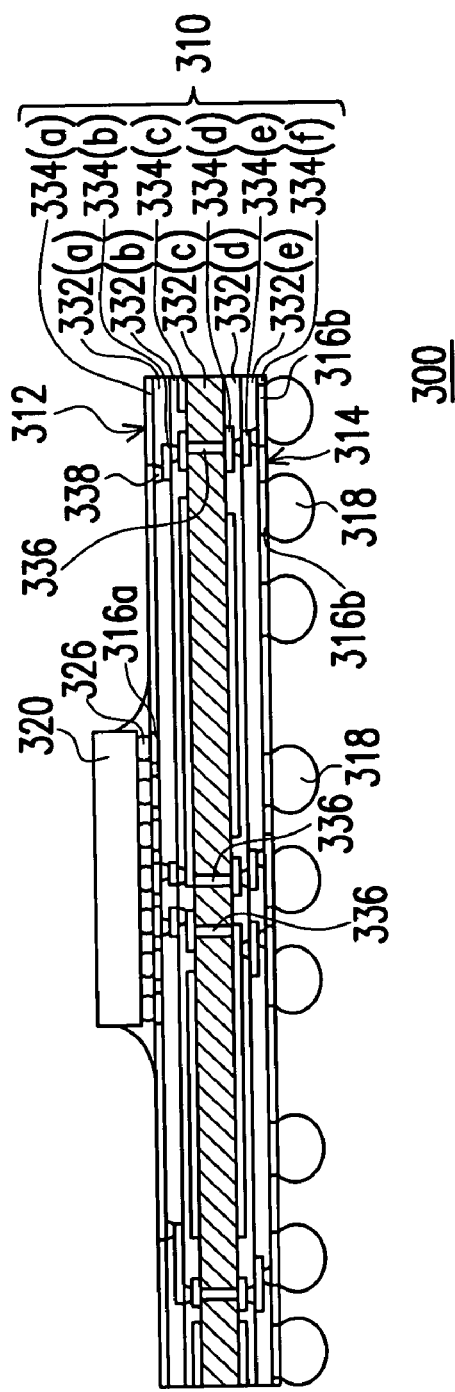
FIG. 4 is a schematic cross-sectional view of a chip package structure according to a first preferred embodiment of this invention.

FIG. 4 is a schematic cross-sectional view of a chip package structure according to a first preferred embodiment of this invention. As shown in FIG. 4, a chip package structure 300 comprising a hybrid integrated circuit (IC) carrier 310 and a chip 320 is provided. The chip 320 is attached to a first surface 312 of the hybrid IC carrier 310 using a flip chip bonding (or wire bonding) technique. The chip 320 is electrically connected to the hybrid IC carrier 310 via a plurality of bonding pads 316a on the first surface 312. In addition, a plurality of contacts 318 is also attached to a second surface 314 of the hybrid IC carrier 310. The contacts 318 are solder balls, contact pins or conductive bumps, for example.

In FIG. 4, a six-layered hybrid chip package substrate 300 is used as an example. A dielectric layer 332 is sandwiched between every pair of neighboring patterned conductive layers 334. At least one of the dielectric layers 332 is a ceramic dielectric layer 332(c) and at least one of the remaining dielectric layers 332 is an organic dielectric layer. Here, the dielectric layers 332(a), 332(b), 332(d) and 332(e) are all organic dielectric layers. Preferably, two organic dielectric layers 332(b) and 332(a) are sequentially formed over the upper surface of the ceramic dielectric layer 332(c) using a built-up method. Similarly, two organic dielectric layers 332(d) and 332(e) are sequentially formed over the lower surface of the ceramic dielectric layer 332(c) using a built-up method. With this arrangement, the dielectric layers 332 are symmetrically formed on two sides of the ceramic dielectric layer 332(c). A plurality of conductive through holes 336 pass through the ceramic dielectric layer 332(c) with their terminals connecting the patterned conductive layers 334(c) and 334(d) respectively. Furthermore, a plurality of vias 338 are buried within the organic dielectric layers 332(a), 332(b), 332(d), 332(e) outside the ceramic dielectric layer 332(c). The vias 338 connects neighboring patterned conductive layers 334 electrically. The outermost patterned conductive layers 334(a), 334(f) also include a plurality of bonding pads 316a and 316b respectively. The bonding pads 316a connect with bumps 326 on the chip 320. In addition, a plurality of contacts 318 are attached to the surface of the bonding pads 316b for connecting with corresponding contacts on the surface of a printed circuit board (not shown).

Note that the dielectric layer 332(c) is fabricated using a ceramic material in a high-temperature/low-temperature cofiring technique. Since the ceramic dielectric layer 332(c) has superior electrical properties, low parasitic inductance and capacitance decoupling capacity, it is an ideal dielectric layer for producing an IC carrier with a high internal circuit density structure. The ceramic dielectric layer 332(c) in FIG. 4 also serves as a dielectric core layer to enhance the hardness of the IC carrier 310 as well. The patterned conductive layers 334 and various organic dielectric layers 332(a), 332(b), 332(d), 332(e) are sequentially stacked on the upper and lower surface of the ceramic dielectric layer 332(c). Because the through holes 336 in the ceramic dielectric layer 332(c) can have a minimum hole diameter of about 95 $\mu$m, the density of circuits of the patterned circuit layers 334(c) and 334(d) is increased. Moreover, pitches of neighboring through holes 336 can be decreased to about 180 $\mu$m. Consequently, overall length of the wire in the patterned conductive layer 334 for connecting the bonding pads 316a and 316b is reduced and signal transmission within the hybrid IC carrier 310 is improved.

Figure 5:
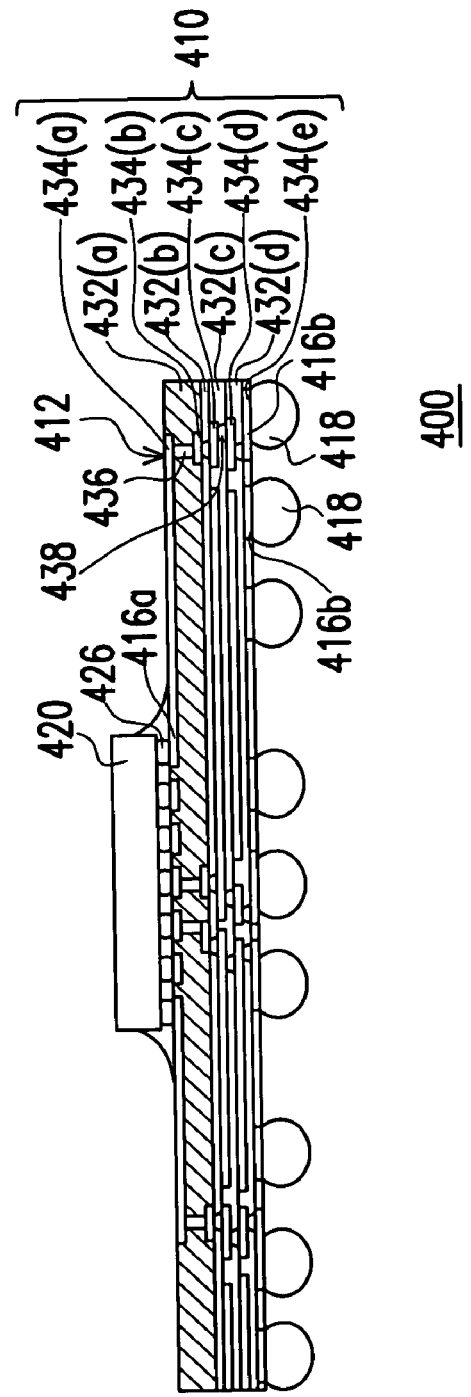
FIG. 5 is a schematic cross-sectional view of a chip package structure according to a second preferred embodiment of this invention.

FIG. 5 is a schematic cross-sectional view of a chip package structure according to a second preferred embodiment of this invention. As shown in FIG. 5, a five-layered hybrid chip package substrate 410 is used as an example. A dielectric layer 432 is sandwiched between every pair of neighboring patterned conductive layers 434. At least one of the dielectric layers 432 is a ceramic dielectric layer 432(a). Furthermore, at least one of the remaining dielectric layers 432 is an organic dielectric layer. Here, the dielectric layers 432(b), 432(c), and 432(d) are organic dielectric layers. The ceramic dielectric layer 432(a) is positioned furthest from the bottommost organic dielectric layer 432(d) and closest to a first surface 412 of the hybrid IC carrier 410. In addition, the upper surface of the ceramic dielectric layer 432(a) has a patterned conductive layer 434(a) with a plurality of bonding pads 416a thereon for connecting with corresponding bumps attached to a chip 420. The lower surface of the ceramic dielectric layer 432(a) has a plurality of organic dielectric layers 432(b), 432(c), and 432(d) sequentially formed in a built-up process. A plurality of conductive through holes 436 pass through the ceramic dielectric layer 432(a) with their terminals connected to the patterned conductive layers 434(a) and 434(b) respectively. Furthermore, a plurality of vias 438 are buried within the organic dielectric layers 432(b), 432(c), and 432(d) outside the ceramic dielectric layer 432(a). The vias 438 connect neighboring patterned conductive layers 434 electrically. The bottommost patterned conductive layer 434(e) has a plurality of bonding pads 416b with a contact 418 attached thereon. The contacts 418 connect with corresponding contacts on the surface of a printed circuit board (not shown). The contacts are solder balls, contact pins or conductive bumps, for example.

The hybrid IC package substrate mainly comprises of a plurality of dielectric layers with each one sandwiched between a pair of neighboring patterned conductive layers. At least one of the dielectric layers is a ceramic dielectric layer while at least one of the remaining dielectric layers is an organic dielectric layer. Furthermore, a plurality of through holes (or vias) pass through various dielectric layers to connect at least a pair of patterned conductive layer. The ceramic dielectric layer can also serve as a dielectric core layer. In addition, both the minimum diameter of a through hole in a ceramic dielectric layer and pitches of neighboring through holes are smaller than pitches of similar through holes in a conventional organic dielectric layer. Hence, the circuit density with the substrate can be higher. Moreover, ceramic has a higher thermal conductivity than an organic material. Thus, a portion of the heat generated by the chip can be conducted away from the hybrid IC carrier via the ceramic dielectric layer. The ceramic dielectric layer also has higher heat resistant and Young's modulus. Therefore, with the ceramic dielectric layer embedded within the substrate, the substrate can have a better warp and distortion resistant against heat than one fabricated using only organic dielectric layers. Lastly, overall thickness of the hybrid IC carrier can be reduced when a ceramic dielectric layer is used.

In summary, major advantages of the hybrid IC package substrate includes:

1. Smaller through holes can be fabricated when a ceramic dielectric layer instead of an organic dielectric layer is used. Thus, overall circuit density within the patterned circuit layer can be increased.

2. Smaller pitches of neighboring through holes are permitted when a ceramic instead of an organic dielectric layer is used. Hence, overall length of wire within the patterned conductive layer for connecting bonding pads can be reduced.

3. A ceramic dielectric layer has superior electrical properties, lower parasitic inductance and higher capacitance decoupling capacity than an organic dielectric layer. Therefore, the hybrid IC carrier is particular suitable for fabricating a chip package with high circuit density and high pin count.

4. Ceramic material is more rigid than organic compound. Therefore, a substrate having a ceramic dielectric layer therein is more capable of resisting warping or distortion while temperature changing. Furthermore, because ceramic material has a greater hardness than organic compound, overall thickness of the package substrate can be reduced when a ceramic instead of an organic dielectric layer is used.

5. Ceramic material has a higher thermal conductivity than organic dielectric material. Hence, a chip package having a hybrid IC carrier of this invention can have a higher heat-dissipating capacity.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A chip package structure, comprising:
    a hybrid integrated circuit (IC) carrier having a first surface and a second surface, wherein the hybrid IC carrier at least having:
        a plurality of patterned conductive layers stacked over each other, wherein the patterned conductive layer closest to the first surface furthermore has a plurality of bonding pads thereon;
        a plurality of dielectric layers respectively sandwiched between a pair of neighboring patterned conductive layers, wherein at least one of the dielectric layers is a ceramic dielectric layer with one ceramic dielectric layer positioned with all the remaining dielectric layers on one side thereof, and at least one of the remaining dielectric layer is an organic dielectric layer; and
        a plurality of vias passing through at least the dielectric core layer for connecting at least two of the patterned conductive layers electrically; and
    a chip attached to the first surface of the hybrid IC carrier and connected electrically to the hybrid IC carrier via the bonding pads, wherein the ceramic dielectric layer is attached to the chip on the first surface of the hybrid IC carrier.

2. The chip package structure of claim 1, wherein the chip is electrically connected to the hybrid IC carrier through a flip chip bonding or a wire bonding process.

3. The chip package structure of claim 1, wherein the package furthermore comprises a plurality of contacts attached to the second surface of the hybrid IC carrier.

* * * * *